US008451887B2

(12) United States Patent
Chen et al.

(10) Patent No.: US 8,451,887 B2
(45) Date of Patent: May 28, 2013

(54) PHASE INTERLEAVING CONTROL METHOD FOR A MULTI-CHANNEL REGULATOR SYSTEM

(75) Inventors: An-Tung Chen, Pingjen (TW); Shao-Hung Lu, Taoyuan (TW); Isaac Y. Chen, Jubei (TW)

(73) Assignee: Richtek Technology Corp., Hsinchu (TW)

( * ) Notice: Subject to any disclaimer, the term of this patent is extended or adjusted under 35 U.S.C. 154(b) by 144 days.

(21) Appl. No.: 13/087,466

(22) Filed: Apr. 15, 2011

(65) Prior Publication Data
US 2011/0260765 A1 Oct. 27, 2011

(30) Foreign Application Priority Data

Apr. 21, 2010 (TW) ................................ 99112518 A

(51) Int. Cl.
*H03K 7/08* (2006.01)
(52) U.S. Cl.
USPC ........... 375/238; 375/237; 375/356; 375/373; 375/376; 375/295

(58) Field of Classification Search
USPC .................. 375/238, 237, 356, 373, 376, 295
See application file for complete search history.

(56) References Cited

U.S. PATENT DOCUMENTS

| 7,499,500 B2 * | 3/2009 | Page ............................ 375/295 |
| 2006/0255866 A1 * | 11/2006 | Hirai ............................. 331/45 |
| 2008/0019436 A1 * | 1/2008 | Wu et al. ....................... 375/238 |

* cited by examiner

*Primary Examiner* — Kabir A Timory
(74) *Attorney, Agent, or Firm* — Rosenberg, Klein & Lee

(57) ABSTRACT

A multi-channel regulator system includes serially connected PWM integrated circuits, each of which determines a PWM signal for a respective channel to operate therewith, and individually controls its operation mode according to whether or not an external clock is detected. Therefore, each channel will not be limited to operate under a constant mode and could become a master channel or a slave channel. Additionally, each of the PWM integrated circuits generates a phase shifted synchronous clock for its next channel during it is enabled, and thus all the channels operate in a synchronous but phase interleaving manner.

22 Claims, 5 Drawing Sheets

US 8,451,887 B2

1

PHASE INTERLEAVING CONTROL METHOD FOR A MULTI-CHANNEL REGULATOR SYSTEM

FIELD OF THE INVENTION

The present invention is related generally to a multi-channel regulator system and, more particularly, to a multi-channel phase interleaved regulator system.

BACKGROUND OF THE INVENTION

As shown in FIG. 1, a multi-channel regulator system includes a plurality of common input channels 10 for converting an input voltage Vin into a plurality of output voltages Vo1-VoN, respectively. Each channel 10 includes a pulse width modulation (PWM) integrated circuit (IC) 12 and a power stage 14, in which the PWM IC 12 generates a pulse width modulation signal pwm responsive to a synchronous clock to drive the power stage 14 to convert the voltage Vin. Since the pulse width modulation signals pwm of all the channels 10 are triggered by the same synchronous clock, all the channels 10 will simultaneously draw current from the common input power supply Vin at the moment of switching all the pulse width modulation signals pwm on, and cause greater ripples in the input voltage Vin. Although increasing the decoupling capacitor Cde will help decrease the ripples in the input voltage Vin, such increase also increases the circuit size and costs, and degrades the transient response.

Another approach to improve the ripples in the input voltage Vin is based on interleaved synchronous clocks. There have been many arts proposed for phase interleaving clock synchronization, most using a master channel to provide a plurality of synchronous but phase interleaved clocks for the slave channels, for example U.S. Pat. No. 7,259,687 and TI's Product No. TPS40180. However, each existing solution for phase interleaving clock synchronization has a fixed master/slave configuration once the master channel and the slave channels are set. Since the master/slave configuration cannot be rearranged, the system is lack of flexibility. Moreover, the master channel must always keep enabled, and the phase delay for clocks it provides for the slave channels is fixed after each setting, so that the number of the slave channels cannot be increased or decreased arbitrarily. In other words, the amount of the channels for a multi-channel regulator system cannot be increased or decreased arbitrarily.

Therefore, it is desired a method for a multi-channel phase interleaved regulator system capable of enabling and disabling each channel on the fly and automatically rearranging the master/slave configuration.

SUMMARY OF THE INVENTION

An objective of the present invention is to provide a phase interleaving control method for a multi-channel regulator system.

According to the present invention, a multi-channel regulator system includes a plurality of PWM ICs in series, each of which determines a pulse width modulation signal for a respective channel and performs the steps of: detecting a phase setting device during power on reset to define a phase delay; transiting to a first state for a slave mode after power on reset if a first clock is detected from the previous channel; during the slave mode triggering the pulse width modulation signal with the first clock and generating a second clock synchronous to but phase interleaved with the first clock using the phase delay; transiting to a second state for a master mode if no clock is detected from the previous channel; during the master mode triggering the pulse width modulation signal with an internal clock and generating a third clock synchronous to but phase interleaved with the internal clock using the phase delay; if the cycle variation of the first clock during the slave mode reaches a threshold, transiting to the second state and using the internal clock to trigger the pulse width modulation signal; and if the first clock is detected during the master mode, transiting to the first state and triggering the pulse width modulation signal with the first clock.

According to the present invention, each PWM IC individually controls its operation mode depending on whether or not an external clock is detected, and thus its operation mode is not fixed. Therefore, the channels of a multi-channel regulator system can be expended or reduced on the fly, and the master/slave configuration can be rearranged.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
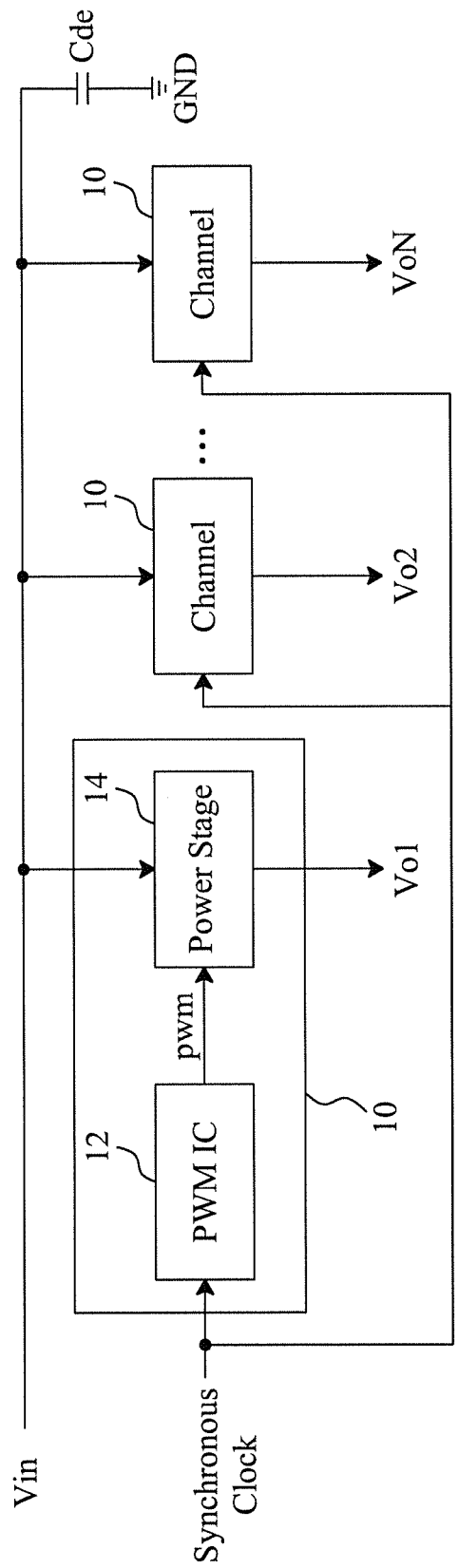
FIG. 1 is a conventional multi-channel regulator system.
Figure 2:
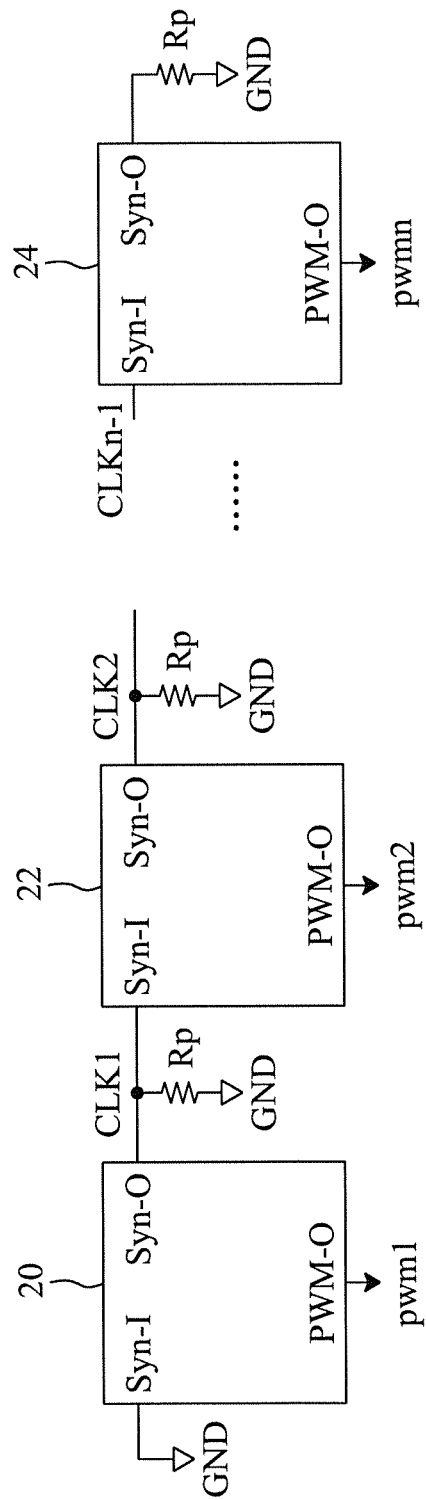
FIG. 2 is a first embodiment according to the present invention.

In a first embodiment according to the present invention, referring to FIG. 2, a multi-channel regulator system includes a plurality of PWM ICs 20-24 connected in series, and each of the PWM ICs 20-24 controls a channel and has an input pin Syn-I for receiving a synchronous clock, an output pin Syn-O for providing a synchronous clock, and an output pin PWM-O for providing a pulse width modulation signal. Except that the input pin Syn-I of the PWM IC 20 in the first stage is grounded, the input pin Syn-I of each of the other PWM ICs 22-24 is connected to the output pin Syn-O of its previous stage. The output pin Syn-O of each of the PWM ICs 20-24 is connected with a resistor Rp which functions as a phase setting device to set the phase of the synchronous clock provided to the next stage. Alternatively, the resistor Rp may be integrated into the PWM IC it is connected therewith. For each of the PWM ICs 20-24, since the functions of phase setting and clock outputting use a same pin Syn-O, the number of pins can be reduced.

Figure 3:
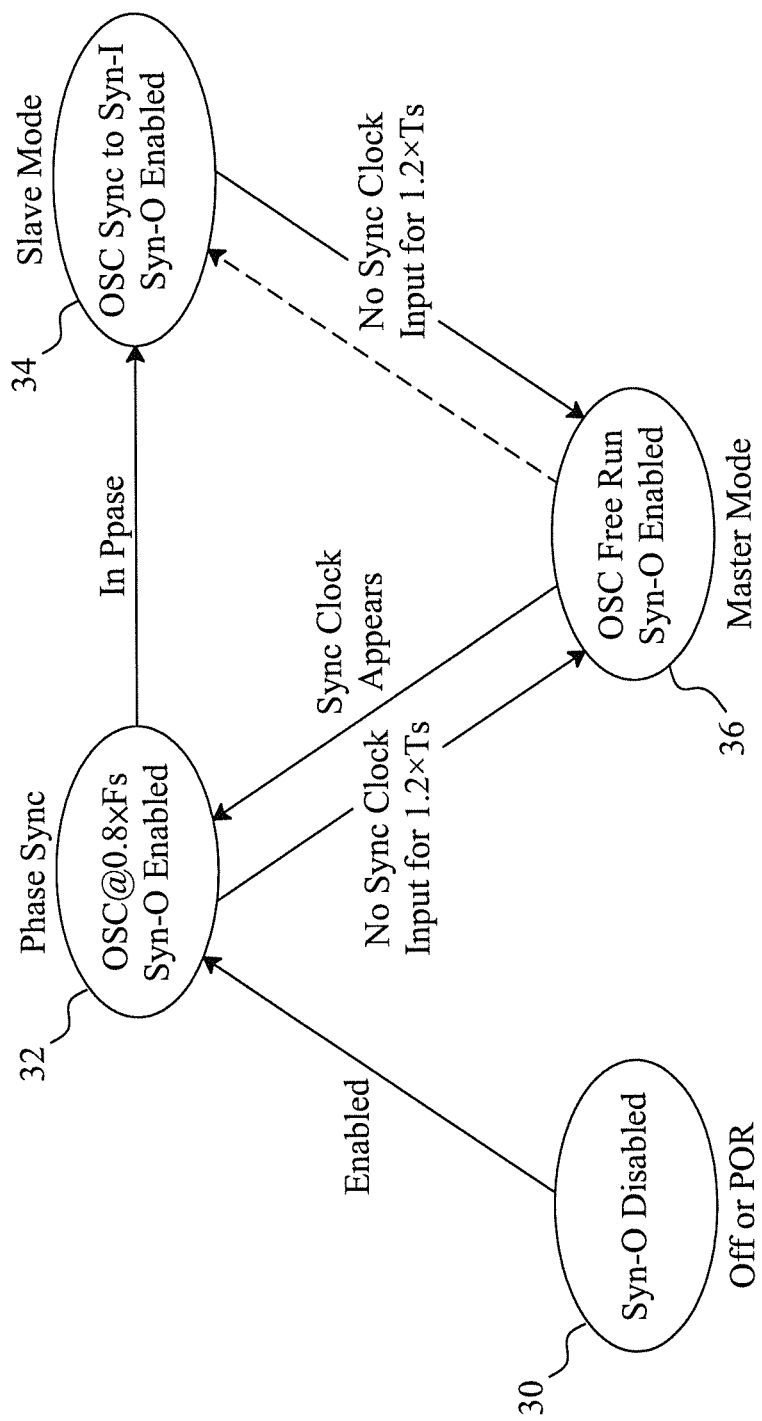
FIG. 3 is a state machine for the PWM ICs shown in FIG. 2.

FIG. 3 is a state machine for the PWM ICs shown in FIG. 2. Taking the PWM IC 22 in the second stage for example, when it is off or during power on reset (POR), as indicated by a state 30, the output pin Syn-O of the PWM IC 22 keeps at a preset state, which will be considered by the next stage as no synchronous clock input to the next stage. That is, the third stage can detect the preset state of the output pin Syn-O of the PWM IC 22 in the second stage from the input pin Syn-I of the third stage, and identifies the preset state as no synchronous clock input to the third stage. In addition, during POR, the PWM IC 22 will detect the resistance of the resistor Rp on its output pin Syn-O for defining a phase delay.

After POR, the PWM IC 22 transits to another state 32 for phase synchronization, during which the PWM IC 22 will detect its input pin Syn-I for synchronous clock CLK1 from its previous stage, i.e., the first stage in this embodiment. If no synchronous clock input is detected over a preset time, the PWM IC 22 will transit to a state 36 for master mode, during which the PWM IC 22 uses its internal clock OSC to trigger its pulse width modulation signal pwm2. The preset time for detecting the synchronous clock input is longer than the cycle Ts of the pulse width modulation signal pwm2 or the internal clock OSC, for example, equal to 1.2×Ts. Contrarily, if any synchronous clock input is detected during the state 32, i.e., the synchronous clock CLK1 is received from the first stage PWM IC 20, the PWM IC 22 will start a process to synchronize its internal clock OSC to the external clock CLK1. Once the phase difference between these two signals OSC and CLK1 is smaller than a preset threshold, the PWM IC 22 will transit to a state 34 for slave mode, during which the pulse width modulation signal pwm2 synchronizes to the external clock CLK1. The above clock synchronization process may alter the phase difference between the internal clock OSC and the external clock CLK1 by changing the frequency of the internal clock OSC, thereby making the two in phase. In other embodiments, if the PWM IC 22 detects the synchronous clock CLK1 during the state 32, it may directly transit to the state 34 without starting any clock synchronization process, and use the synchronous clock CLK1 to trigger its pulse width modulation signal pwm2 during the slave mode.

During the state 34, the PWM IC 22 conforms its internal clock OSC to the synchronous clock CLK1, and generates a clock CLK2 synchronous to but phase interleaved with the synchronous clock CLK1 depending on the phase delay defined by the resistor Rp for the next stage, i.e. the third stage in this embodiment. Furthermore, when the PWM IC 22 detects the cycle of the synchronous clock CLK1 varying over a preset threshold, for example, from Ts to 1.2Ts or 0.8Ts, it will transit to the state 36 for master mode.

During the state 36, the internal clock OSC of the PWM IC 22 may be any arbitrary clock, and the PWM IC 22 generates the clock CLK2 that is synchronous to but phase interleaved with the internal clock OSC depending on the phase delay for the PWM IC of the next stage. When detecting a synchronous clock CLK1 coming from the PWM IC 20 of the previous stage, the PWM IC 22 may first transit to the state 32 to perform the clock synchronization process and then transit to the state 34 for slave mode, or may directly transit to the state 34 for slave mode during which the synchronous clock CLK1 is used to trigger the pulse width modulation signal pwm2.

Referring to FIG. 2, since each of the PWM ICs 20-24 defines a respective phase delay based on the resistor Rp on its output pin Syn-O, and uses the phase delay to generate a clock that is synchronous to but phase interleaved with its pulse width modulation signal for the next stage, the pulse width modulation signal of the PWM IC in the next stage will be synchronous to but phase interleaved with the pulse width modulation signal of the PWM IC in the previous stage. When the number of the PWM ICs is increased or decreased, the pulse width modulation signal generated by each of the PWM ICs will be always synchronous to but phase interleaved with the pulse width modulation signals of its previous and next stages, and thus the number of the serially connected PWM ICs 20-24 can be increased or decreased on the fly. In other words, the number of the channels in a multi-channel regulator system can be expended or reduced on the fly. Additionally, a conventional multi-channel regulator system has a fixed master/slave configuration, i.e., the PWM ICs of the master channel and the slave channels are fixed, and the master channel must always keep enabled; while a control method according to the present invention allows a multi-channel regulator system to rearrange the master/slave configuration and enable and disable any channel on the fly. As illustrated in the above embodiments, each of the PWM ICs 20-24 shown in FIG. 2 can be enabled and disabled on the fly, and can transit from the slave mode to the master mode or from the master mode to the slave mode, i.e., automatically rearrange the master/slave configuration. When any channel in the system is enabled or disabled on the fly, the other active channels' output voltages will not be interrupted, which will help lower the power consumption in some conditions. For example, when the PWM IC 20 in the master mode is disabled, the PWM IC 22 in the next stage automatically turns into the master mode from the slave mode, and when the PWM IC 20 is enabled again, the PWM IC 22 automatically turns into the slave mode from the master mode. In another example, when the PWM IC 20 is enabled and the PWM IC 22 is disabled, the PWM IC in the third stage can automatically turn into the master mode from the slave mode, or the PWM IC 22 can bypass the synchronous clock CLK1 coming from the PWM IC 20 to the PWM IC in the third stage, so that the PWM IC in the third stage will replace the PWM IC 22 to generate the pulse width modulation signal.

Figure 4:
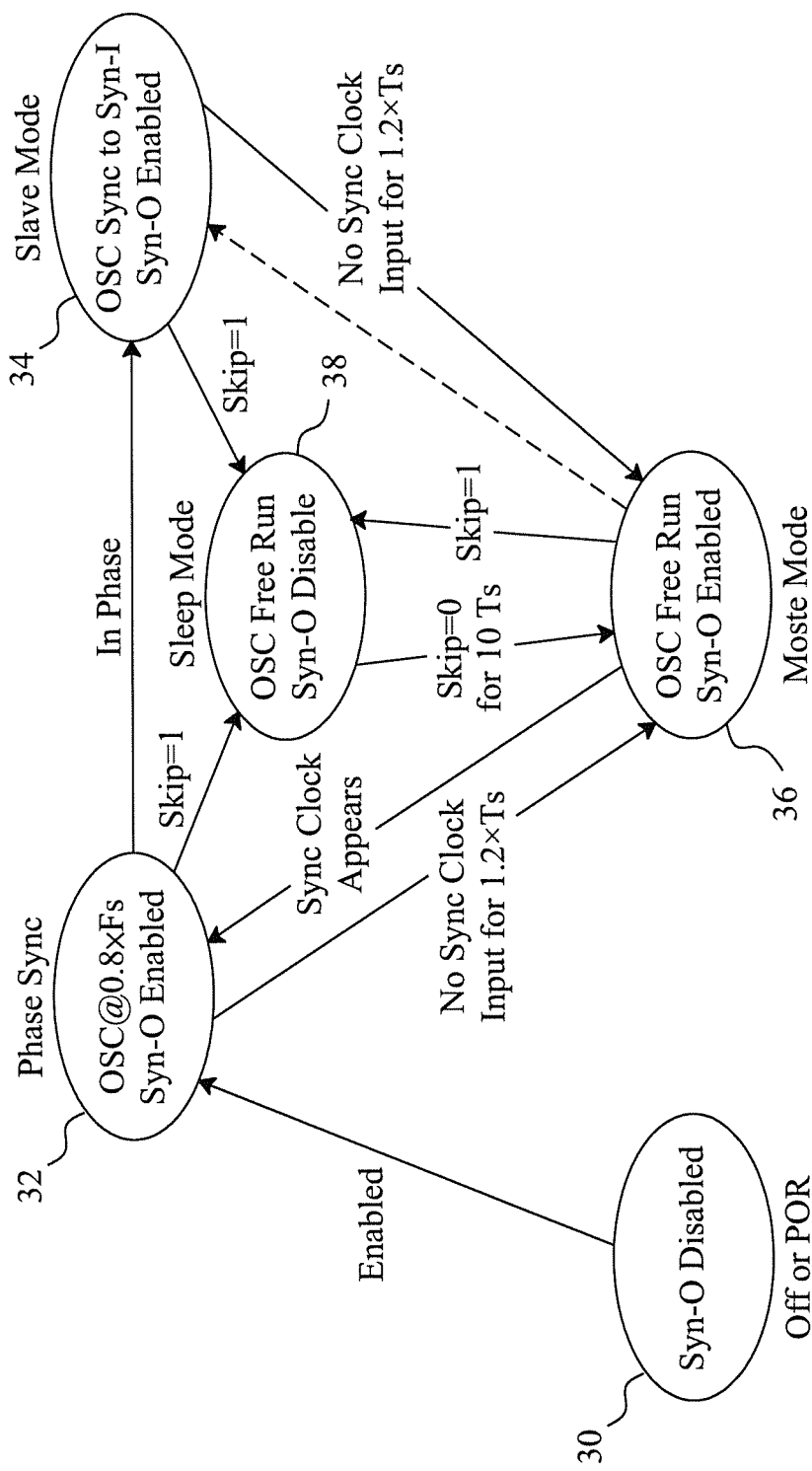
FIG. 4 is another state machine for the PWM ICs shown in FIG. 2.

The control method according to the present invention is also applicable to PWM ICs supporting sleep mode. FIG. 4 is a state machine for the PWM ICs of FIG. 2 supporting sleep mode. In addition to the states 30, 32, 34 and 36 as shown in FIG. 3, there is a further state 38 for sleep mode. During the state 32, 34 or 36, once a sleep signal Skip appears, the PWM IC will transit to the state 38. During the state 38, if the sleep signal Skip disappears for a preset time, for example 10 cycles Ts, the PWM IC will transit to the state 36.

Figure 5:
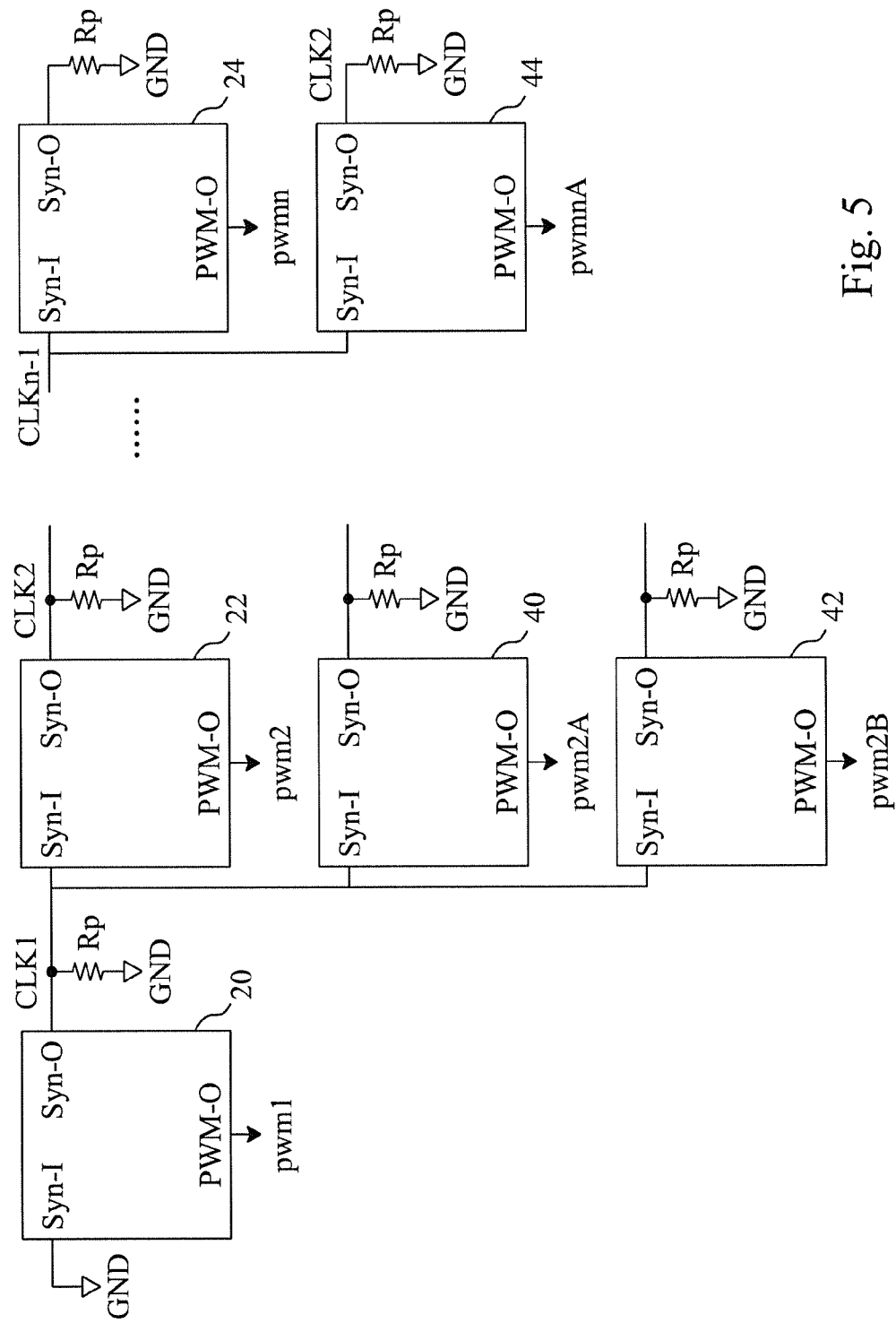
FIG. 5 is a second embodiment according to the present invention.

FIG. 5 is a second embodiment according to the present invention. In addition to the PWM ICs 20-24 as shown in FIG. 2, there are PWM ICs 40 and 42 connected in parallel with the PWM IC 22, and a PWM IC 44 connected in parallel with the PWM IC 24. The PWM ICs 40-44 are similar to the PWM ICs 20-24, and the control method for the PWM ICs 40-44 is similar to that illustrated in FIG. 3 and FIG. 4.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A phase interleaving control method for a multi-channel regulator system including a plurality of pulse width modulation integrated circuits connected in series, each said pulse width modulation integrated circuit determining a pulse width modulation signal for a respective channel, the method comprising operating each said pulse width modulation integrated circuit to perform the steps of:

(A) during a first state detecting if any external clock appears at an input pin of said pulse width modulation integrated circuit;
   (B) if a first clock is detected in the step A, then performing the steps of:
   transiting to a second state for a slave mode;
   triggering the pulse width modulation signal with the first clock; and
   generating a second clock synchronous to and phase interleaved with the first clock, and outputting the second clock through an output pin of said pulse width modulation integrated circuit; and (C) if no external clock is detected in the step A, then performing the steps of:

transiting to a third state for a master mode;

triggering the pulse width modulation signal with an internal clock of said pulse width modulation integrated circuit; and generating a third clock synchronous to and phase interleaved with the internal clock, and outputting the third clock through said output pin.

2. The method of claim 1, further comprising the step of defining a phase delay based on a phase setting device inside or outside said pulse width modulation integrated circuit.

3. The method of claim 2, wherein the second clock is generated using the phase delay.

4. The method of claim 2, wherein the third clock is generated using the phase delay.

5. The method of claim 1, further comprising the step of defining a phase delay based on a phase setting device on said output pin.

6. The method of claim 5, wherein the second clock is generated using the phase delay.

7. The method of claim 5, wherein the third clock is generated using the phase delay.

8. The method of claim 5, further comprising the step of making said output pin at a preset state during a fourth state.

9. The method of claim 1, further comprising the step of defining a phase delay based on a resistor on said output pin.

10. The method of claim 9, wherein the second clock is generated using the phase delay.

11. The method of claim 9, wherein the third clock is generated using the phase delay.

12. The method of claim 9, further comprising the step of making said output pin at a preset state during a fourth state.

13. The method of claim 1, further comprising the steps of:

if a fourth clock appears at said input pin during the master mode, controlling a phase of the pulse width modulation signal; and when a phase difference between the pulse width modulation signal and the fourth clock becomes less than a threshold, transiting to the second state.

14. The method of claim 1, further comprising the step of transiting to the third state if the first clock disappears for a threshold time during the slave mode.

15. A phase interleaving control method for a multi-channel regulator system including a plurality of pulse width modulation integrated circuits connected in series, each said pulse width modulation integrated circuit determining a pulse width modulation signal for a respective channel, the method comprising operating each said pulse width modulation integrated circuit to perform the steps of:

(A) detecting a phase setting device to define a phase delay during a power on reset of said pulse width modulation integrated circuit;

(B) after the power on reset, if a first clock coming from a previous channel is detected, transiting to a first state for a slave mode and triggering the pulse width modulation signal with the first clock, otherwise transiting to a second state for a master mode and triggering the pulse width modulation signal with an internal clock of said pulse width modulation integrated circuit;

(C) during the slave mode, generating a second clock synchronous to and phase interleaved with the first clock using the phase delay, and once a cycle variation of the first clock reaches a threshold, transiting to the second state and triggering the pulse width modulation signal with the internal clock; and (D) during the master mode, generating a third clock synchronous to and phase interleaved with the internal clock using the phase delay, and once a fourth clock coming from the previous channel is detected, transiting to the first state and triggering the pulse width modulation signal with the fourth clock.

16. The method of claim 15, wherein the step D comprises the steps of:

upon detecting the fourth clock, controlling a phase of the pulse width modulation signal; and when a phase difference between the pulse width modulation signal and the fourth clock becomes less than a threshold, transiting to the first state.

17. The method of claim 15, further comprising the step of transiting to a third state if a sleep signal is detected after the power on reset.

18. The method of claim 17, further comprising the step of transiting to the second state if the sleep signal disappears for a preset time during the third state.

19. The method of claim 15, further comprising the step of transiting to a third state if a sleep signal is detected during the first state.

20. The method of claim 19, further comprising the step of transiting to the second state if the sleep signal disappears for a preset time during the third state.

21. The method of claim 15, further comprising the step of transiting to a third state if a sleep signal is detected during the second state.

22. The method of claim 21, further comprising the step of transiting to the second state if the sleep signal disappears for a preset time during the third state.

* * * * *